(12) United States Patent
Sheehan (10) Patent No.: US 7,707,524 B2
(45) Date of Patent: Apr. 27, 2010

(54) OSCULATING MODELS FOR PREDICTING THE OPERATION OF A CIRCUIT STRUCTURE

(75) Inventor: Bernard N Sheehan, St. Paul, MN (US)

(73) Assignee: Mentor Graphics Corporation, Wilsonville, OR (US)

( * ) Notice: Subject to any disclaimer, the term of this patent is extended or adjusted under 35 U.S.C. 154(b) by 505 days.

(21) Appl. No.: 10/856,425

(22) Filed: May 27, 2004

(65) Prior Publication Data

US 2004/0268276 A1    Dec. 30, 2004

Related U.S. Application Data

(60) Provisional application No. 60/473,906, filed on May 27, 2003.

(51) Int. Cl.
*G06F 17/50* (2006.01)
*G06F 9/45* (2006.01)

(52) U.S. Cl. .................. 716/4; 716/1; 716/2; 716/5; 716/10; 703/2; 703/19

(58) Field of Classification Search .................. 716/1, 716/2, 4, 5, 10; 703/2, 19; 327/359; 324/678
See application file for complete search history.

(56) References Cited

U.S. PATENT DOCUMENTS

| | | | | |
|---|---|---|---|---|
| 6,051,995 | A * | 4/2000 | Pollachek | 326/87 |
| 6,314,546 | B1 * | 11/2001 | Muddu | 716/5 |
| 6,405,348 | B1 * | 6/2002 | Fallah-Tehrani et al. | 716/4 |
| 6,496,960 | B1 * | 12/2002 | Kashyap et al. | 716/4 |
| 6,552,551 | B2 * | 4/2003 | Komoda et al. | 324/678 |
| 6,560,752 | B1 * | 5/2003 | Alpert et al. | 716/2 |
| 6,725,438 | B2 * | 4/2004 | van Ginneken | 716/10 |
| 6,799,153 | B1 * | 9/2004 | Sirichotiyakul et al. | 703/19 |
| 6,845,348 | B1 * | 1/2005 | Subbarao et al. | 703/2 |
| 7,013,440 | B2 * | 3/2006 | Croix | 716/4 |
| 7,346,867 | B2 * | 3/2008 | Su et al. | 716/4 |
| 7,359,843 | B1 * | 4/2008 | Keller et al. | 703/2 |
| 2003/0201815 | A1 * | 10/2003 | Tung et al. | 327/359 |

(Continued)

OTHER PUBLICATIONS

Sheehan, B.N.; "Osculating Therenin model for predicting delay and slew of capacitively characterized cells", Jun. 10-14, 2002, Design Automation Conference, Proceedings. 39th, pp. 866-869.*

(Continued)

*Primary Examiner*—Helen Rossoshek
(74) *Attorney, Agent, or Firm*—Banner & Witcoff, Ltd (57) ABSTRACT

Various techniques and tools are disclosed for providing an osculating model of a circuit, which can be used to more accurately predict the circuit's operation. The parameters for a general model of the circuit are determined such that the general model matches desired circuit characteristics at one or more points. The parameters for the general model are determined such that the slopes of the general model at those points also match desired circuit characteristics. These determined parameters are used to create an osculating model specific to the circuit. The osculating model of the circuit can be employed to predict the operation of the circuit. Particular implementations of these techniques and tools may be used to predict the timing characteristics of a circuit having a capacitive, inductive, or magnetically-coupled load.

18 Claims, 5 Drawing Sheets

U.S. PATENT DOCUMENTS

2008/0243414 A1* 10/2008 Oh et al. .................. 702/85

OTHER PUBLICATIONS

Jang et al., "A prediction algorithm for feedback control models with long delays", Dec. 2-4, 1997, Broadband Switching Systems, Proceedings. 2nd IEEE International Workshop on, pp. 131-136.*

Agarwal et al., "A library compatible driver output model for on-chip RLC transmission lines", Jan. 2004, Computer-Aided Design of Integrated Circuits and Systems, IEEE Transactions on, vol. 23, Issue 1, pp. 128-136.*

F. Dartu et al., "Performance Computation for Precharacterized CMOS Gates with RC Loads," *IEEE Trans. Computer Aided Design*, May 1996, pp. 544-553.

F. Dartu et al., "A Gate Model for High-Speed CMOS Circuits," *DAC 94*, pp. 576-580.

A. B. Kahng et al., "New Efficient Algorithms for Computing Effective Capacitance," *ISPD 98*, pp. 147-151.

R. Macys et al., "A New Algorithm for Computing the 'Effective Capacitance' in Deep Submicron Circuits," *IEEE Custom Integrated Circuits Conf.* 1998, pp. 313-316.

P. O'Brien et al., "Modeling the Driving Point Characteristic of Resistive Interconnect for Accurate Delay Estimation," *ICCAD 89*, pp. 512-515.

R. Arunachalam et al., "CMOS Gate Delay Models for General RLC Loading," *ICCAD 97*, pp. 224-229.

J. Qian et al., "Modeling the 'Effective Capacitance' for the RC Interconnect of CMOS Gates," *IEEE Trans. Computer Aided Design*, Dec. 1994, pp. 1526-1535.

F. Dartu et al., "Calculatng Worst-Case Gate Delays Due to Dominant Capacitance Coupling," *DAC 97*, pp. 46-51.

P. Gross et al., "Determination of Worst-Case Aggressor Alignment for Delay Calculation," *ICCAD 98*, 8 pages.

Sheehan, B.N., Library Compatible Ceff for Gate-Level Timing; Design, Automation and Test in Europe Conference and Exhibition, 2002, Proceedings Mar. 4-8, 2002, pp. 826-830.

Ousterhout, J. K., "A Switch-Level Timing Verifier for Digital MOS VLSI," Trans. on CAD, vol. 4, No. 3, 1985, pp. 336-349.

* cited by examiner

OSCULATING MODELS FOR PREDICTING THE OPERATION OF A CIRCUIT STRUCTURE

This application claims priority to provisional U.S. Application No. 60/473,906 filed May 27, 2003, entitled "Osculating Thevenin Model For Predicting Delay And Slew With RC Loading Using Capacitively Characterized Cell Timing Libraries" and naming Bernard N. Sheehan as inventor, which provisional patent application is incorporated entirely herein by reference.

FIELD OF THE INVENTION

The invention is directed toward generating a specific model for the operation of a circuit from a generic model for the operation of the circuit, and then employing the specific model to estimate one or more operating characteristics of the circuit. Various embodiments of the invention are particularly suited toward employing a specific model for an electronic circuit with resistive-capacitive (RC) loading to determine the delay, output slew and effective capacitance of the electronic circuit.

BACKGROUND OF THE INVENTION

Microcircuit devices have become commonly used in a variety of products, from automobiles to microwaves to personal computers. As the importance of these devices grows, manufacturers continue to improve these devices. Each year, for example, microcircuit device manufacturers develop new techniques that allow microcircuit devices, such as programmable microprocessors, to be more complex and yet still smaller in size.

As microcircuit devices become more complex, they also become more difficult to design and test. A conventional microcircuit device, for example, may have many millions of connections, and each connection may cause the microcircuit to operate incorrectly or even fail if the connection is not properly designated. Not only must the connections be properly designated, but the time required for each circuit structure to process or transmit a signal must fall within a desired time constraint. If a circuit structure, such as a transistor gate, takes too long to process a signal, then another circuit structure may not receive the signal in time to operate properly. Similarly, if a circuit structure, such as a wiring line, takes too long to transmit a signal, then another circuit structure may not receive the signal in time to perform its intended task.

Accordingly, when designing or testing a microcircuit, it is often important to consider the timing characteristics of various structures in the circuit. Ideally, it would be desirable to determine the timing characteristics that each circuit structure would exhibit during actual operation with an input signal, sometimes referred to as Dynamic Timing Analysis (DTA). For a circuit of some complexity, however, calculating the dynamic timing for each circuit structure can be extremely time-consuming and impractical. Circuit designers and testers therefore will often try to calculate the timing characteristics that a circuit structure will exhibit without an input signal, sometimes referred to as Static Timing Analysis (STA).

For many years, the methodology used to perform Static Timing Analysis treated the electrical loads on a circuit structure as mere lumped capacitors. With the complexity of modern microcircuit devices, however, Static Timing Analysis is now being used to analyze distributed resistive-capacitive (RC) loads, and some versions even account for magnetic coupling and inductance. Typical Static Timing Analysis techniques perform this exacting interconnect analysis using capacitive characterization data for the output of a circuit with a load (hereafter generically referred to as a "cell" for convenience), driver, or active port of a block or subcircuit. More particularly, cell timing values for arbitrary loads are extrapolated from a sequence of measurements or simulations using only capacitive loads. A conventional Static Timing Analysis technique to achieve this extrapolation operates as follows. First, the load circuit or "cell," however sprawling and complex, is replaced by a single, effective capacitance (referred to as $C_{eff}$). This value is then used to determine the cell's timing data for capacitive loads. Next, the cell itself is replaced by a Thevenin circuit or other simplified linear model that approximately reproduces the cell's timing behavior at $C_{eff}$. Finally, this proxy Thevenin circuit is used to simulate driving the actual load, and the relevant delays and slews for the proxy Thevenin circuit (and thus ideally for the actual cell) are computed.

The accuracy of this replacement strategy, however, depends critically on how well the Thevenin model can replicate the cell's timing behavior. With capacitively loaded circuits, for example, resistive shielding often hides some of the load capacitance, causing the effective capacitance used by the analysis process to be inaccurate. Similarly, the inductance of long connection routes may be significant, and yet may not be accounted for in conventional static timing analysis techniques. Accordingly, it would be desirable to provide static time analysis techniques that can more reliably and accurately predict the operating characteristics of a cell.

BRIEF SUMMARY OF THE INVENTION

Advantageously, various embodiments of the invention provide tools and techniques for creating models that more accurately estimate various characteristics of a cell, such as timing characteristics like the delay and output slew. Some embodiments of the invention, for example, employ a Thevenin model that not only matches a cell's delay and slew at the cell's effective capacitance, but also for capacitive loads in the vicinity of the cell's effective capacitance. Further, various embodiments of the invention may be used to determine the effective capacitance of the cell. Still other embodiments of the invention may used to determine the operating characteristics of circuit structures having inductive or magnetically coupled loads.

DETAILED DESCRIPTION OF THE INVENTION

Overview

Various embodiments of the invention provide tools and techniques for generating osculating models that describe the operation of a circuit structure. As will be explained in detail below, these tools and techniques may be employed to, for example, predict the timing characteristics of a circuit with a load, such as a capacitively loaded circuit, an inductively loaded circuit, or a circuit with a magnetically-coupled load. As will also be discussed in more detail below, these embodiments of the invention can be used to estimate the effective load of a circuit.

Figure 1A:
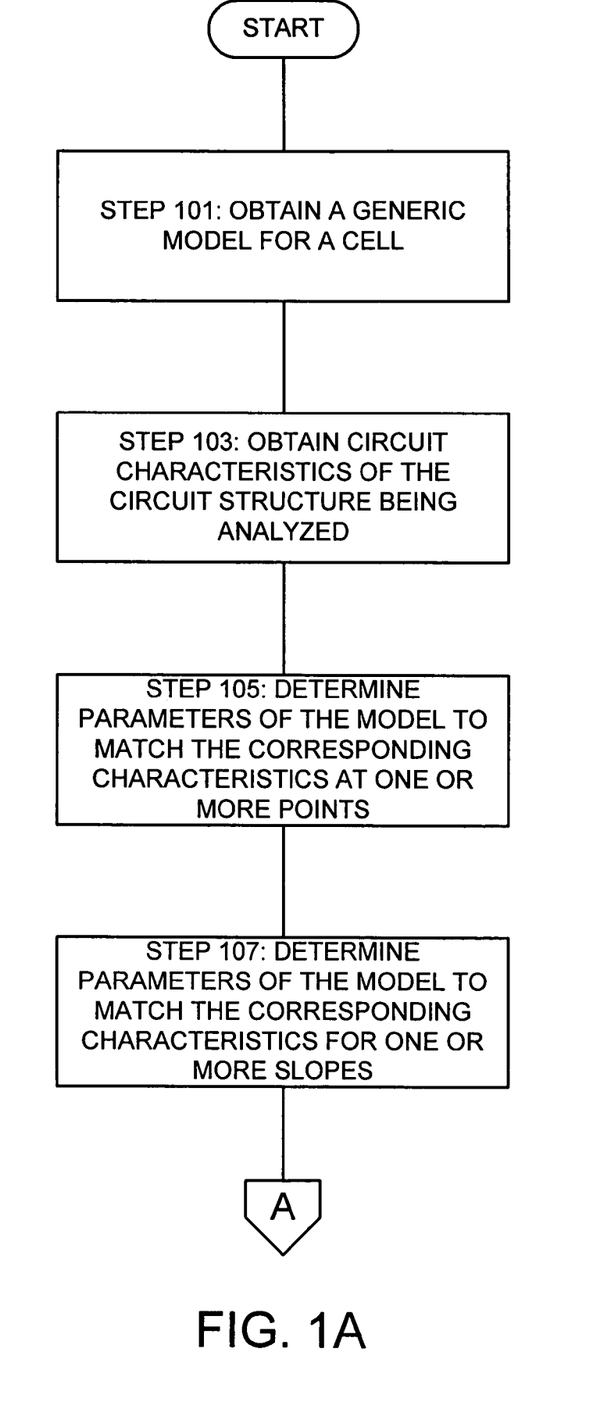
FIGS. 1A and 1B show a method of creating a specific model for a circuit structure according to various embodiments of the invention.
Figure 1B:
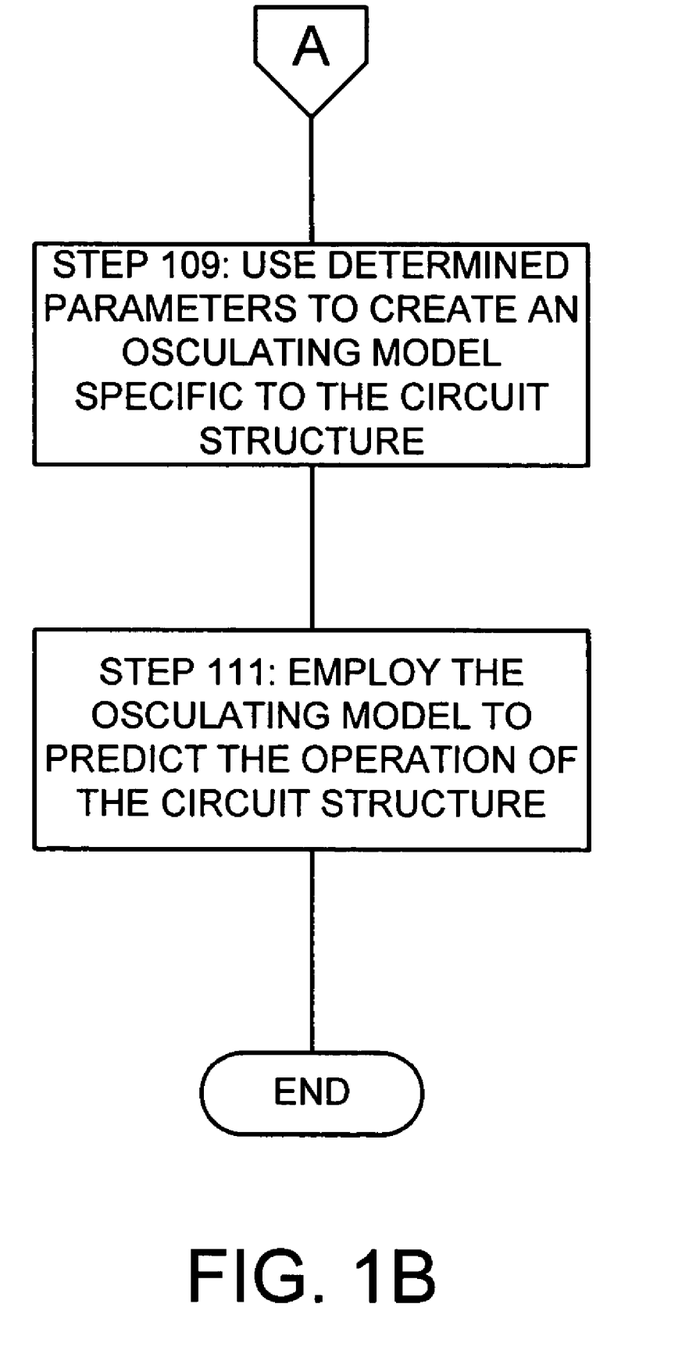

Advantageously, these embodiments of the invention provide an osculating model of a circuit, which can be used to more accurately predict the circuit's operation. A general process for creating such an osculating model according to various embodiments of the invention is shown in FIG. 1. More particularly, in step 101, a generic model for a cell is obtained. As will be appreciated by those of ordinary skill in the art, a variety of models, such as Thevenin models, are known for modeling the operation of a circuit structure. Next, in step 103, circuit characteristics of the circuit structure being analyzed are obtained. As will be discussed in more detail below, these input circuit characteristics may be simulated values obtained, e.g., from simulating the operation of the circuit structure, measured values obtained from measuring the operation of the circuit structure, or specified values that are selected based upon the design of the circuit structure or upon a desired target operation for the circuit structure.

In step 105, the parameters for the general model are determined such that the general model matches the corresponding circuit characteristics at one or more points. More particularly, the parameters that define the model are determined such that, when the model has these parameters, the model matches the desired input circuit characteristics at one or more points. Similarly, in step 107, the parameters for the general model are determined such that the slopes of the general model at those points also match or otherwise correspond with the desired input circuit characteristics. That is, the parameters that define the model are determined such that, when the model has these parameters, the slopes of the model at the matching points also match the appropriate circuit characteristics. It should be noted that, with various embodiments of the invention, the order of step 105 and 107 may be reversed. Alternately, these steps may be performed concurrently (i.e., the model parameter values for matching the points and for matching the slopes are simultaneously obtained).

After the model parameters for matching the model points and slopes have been obtained, these determined parameters are used in step 109 to create an osculating model specific to the circuit structure. Then, in step 111, the osculating model of the circuit structure can be used to predict the operation of the circuit structure. For example, as will now be described in more detail, various embodiments of the invention may be used to predict the timing characteristics of a circuit having a capacitive, inductive, or magnetically-coupled load.

Delay and Slew Prediction Tool

Figure 2:
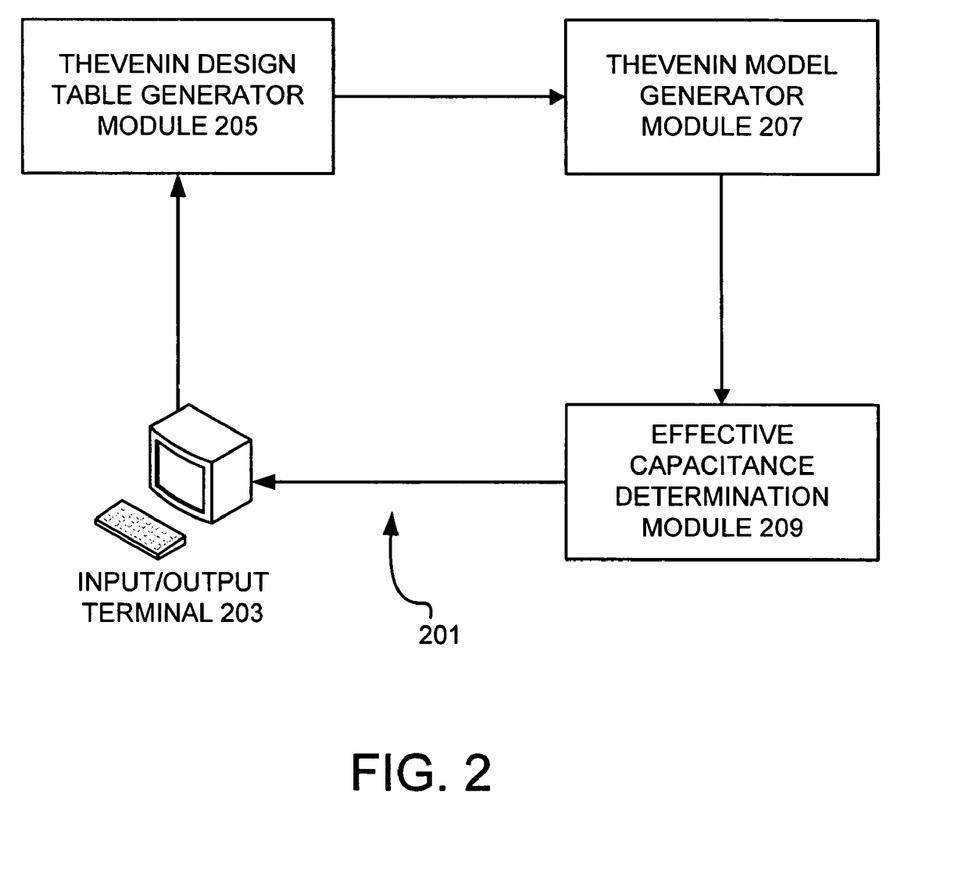
FIG. 2 shows a delay and slew prediction tool that may be implemented according to various embodiments of the invention

FIG. 2 shows a delay and slew prediction tool 201 that may be implemented according to various embodiments of the invention. As seen in this figure, the tool 201 includes an input/output terminal 203, a Thevenin design table generator module 205, and a Thevenin model generator module 207. With various embodiments of the invention, the tool 201 may also include an effective capacitance determination module 209. As will be discussed in more detail below, alternate embodiments of the invention may instead optionally include an effective inductance determination module or an effective magnetic coupling determination module.

It should be appreciated that one or more of these modules may be implemented by software instructions executing on a programmable computer, such as a personal computer, a mainframe computer, or a collection of two or more computers that are networked together or otherwise in communication with one another. With these embodiments, the instructions may be stored on a medium, such as a solid state memory storage device, a magnetic memory storage device, an optical memory storage device, a punched memory storage device, or any other suitable tangible storage medium. Alternately or additionally, the software instructions may be transmitted from another location. For example, with various embodiments of the invention, the instructions may be transmitted from another computing device or storage location over a hard-wired line, by radio frequency waves, by infrared or other optical waves, or by sonic waves. Still further, various embodiments of the invention may even implement one or more of these modules using analog calculating circuits. Also, with different embodiments of the invention, two or more of these modules may be combined into a single module, or the functions of one or more of these modules may be subdivided into smaller modules. Alternately, various functions for these modules may be rearranged between the modules in any desired manner different from that described in detail below.

Timing Analysis Process

Figure 3:
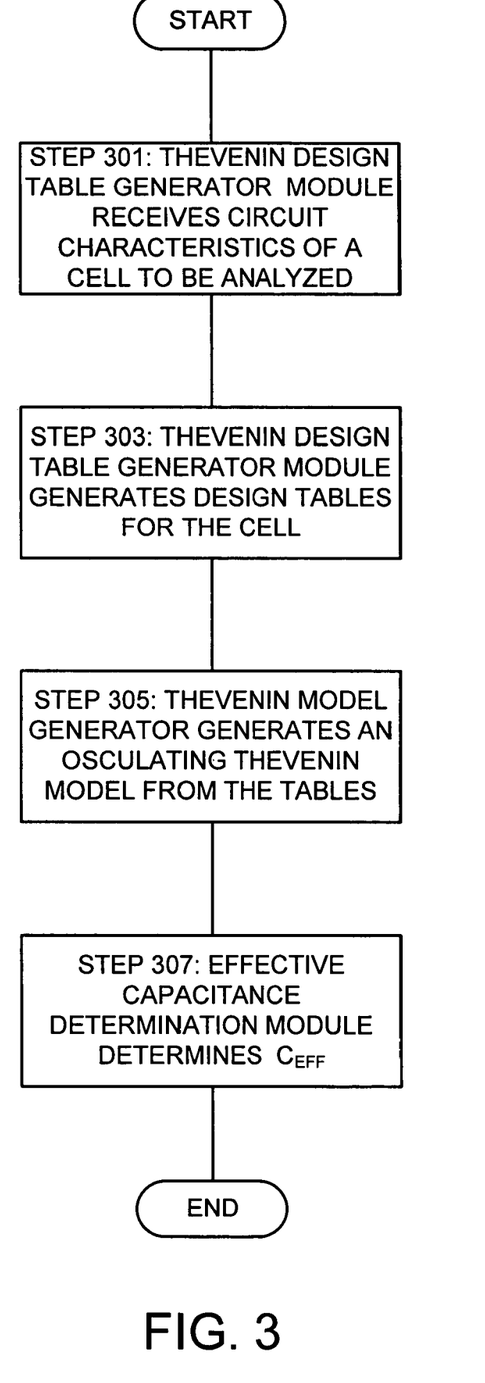
FIG. 3 shows a method of determining the delay, output slew and effective capacitance of a cell according to various embodiments of the invention.

Referring now to FIG. 3, to begin a timing analysis process according to various embodiments of the invention, in step 301 the Thevenin design table generator module 205 receives circuit characteristics of a cell to be analyzed from the input/output terminal 203. With some embodiments of the invention, one or more of the circuit characteristics may be measured from the operation of the cell. Alternately or additionally, one or more of the circuit characteristics may be determined from a simulation of the operation of the cell. Still further, with some embodiments of the invention, the circuit characteristics may be manually or automatically selected based upon, e.g., an analysis of the cell's design or a desired target operation for the cell. Various embodiments of the invention may employ any combination of measured, simulated or selected cell characteristics.

For example, if the delay and slew prediction tool 201 is being used to determine the effective capacitance of a cell, the cell delay, or the output slew of the cell, then the input/output terminal 203 may provide the Thevenin design table generator module 205 with a given operating capacitance $C_O$, a measured or simulated input slew for the cell, and the values $\alpha_L$, $\alpha_D$, $\alpha_H$ by which the cell's output slew and delay are defined. Each of these circuit characteristics will be discussed in more detail below. As will also be discussed below, one or more of these circuit characteristics may alternately be provided directly by the Thevenin design table generator module 205 (or by the Thevenin model generator module 207 for embodiments of the invention that omit the Thevenin design table generator module 205).

Next, in step 303, the Thevenin design table generator module 205 generates tables for designing an osculating Thevenin model of the cell's operating parameters from the provided circuit characteristics. More particularly, the Thevenin design table generator module 205 generates tables that can be used to quickly and efficiently create an osculating Thevenin model of the cell's operation. A conventional timing model for a cell is comprised of a set of tables or equations which give the delay ($t_{delay}$) and output slew ($t_{slewOut}$) of the cell as functions of capacitive load and input slew. Thus, in a timing model for a transistor gate G, the gate delay ($t_{delay}$) and gate output slew ($t_{slewOut}$) may be defined as:

$$t_{delay}^G = f_1(C_L, t_{slewIn}) \quad \text{(Equation 1)}$$

$$t_{slewOut}^G = f_2(C_L, t_{slewIn}) \quad \text{(Equation 2)}$$

Further, delay and slew are conventionally computed, respectively, from the points in time at which the cell's input and output waveforms cross selected voltage thresholds $\alpha_L V_{DD}$, $\alpha_D V_{DD}$, and $\alpha_H V_{DD}$. Typically, $\alpha_L=0.2$, $\alpha_D=0.5$, and $\alpha_H=0.8$. Thus, a conventional timing model will define the gate delay ($t_{delay}$) and gate output slew ($t_{slewOut}$) as:

$$t_{delay}^G = t_D - t_D^{in} \quad \text{(Equation 3)}$$

$$t_{slewOut}^G = t_H - t_L \quad \text{(Equation 4)}$$

where $t_D$ is the time at which the cell's output signal value crosses $\alpha_D V_{DD}$. $t_L$ then is the time at which the cell's output signal value crosses $\alpha_L V_{DD}$, while $t_H$ is the time at which the cell's output signal value crosses $\alpha_H V_{DD}$. It should be noted that the term "slew," as used herein, is an interval of time and not a rate. More particularly, the term "slew" as used herein refers to the difference between the times at which the output signal value for the cell crosses the values $\alpha_L V_{DD}$ and $\alpha_H V_{DD}$, respectively. Accordingly, the voltage thresholds ($\alpha_L V_{DD}$, $\alpha_D V_{DD}$, and $\alpha_H V_{DD}$) that are specified to define both delay and slew are among the circuit characteristics used to create an osculating Thevenin model according to various embodiments of the invention. It should be appreciated that these voltage threshold values may be provided through the input/output terminal 203 on a case-by-case basis. Alternately, one or more of these voltage threshold values may be expressly or inherently provided by the Thevenin design table generator module 205.

A generic Thevenin model or "template" $M(t_0, t_r, R)$ employed by various embodiments of the invention may be based upon the model of a resistance R in series with a saturating voltage ramp. With this type of model, the ramp begins at time to and rises to $V_{DD}$ after an additional time $t_r$. Thus, the response of the generic Thevenin model $M(t_0, t_r, R)$ when driving a capacitor C is $$v_C(t) = V_{DD} v(t - t_0, t_r, RC) \quad \text{(Equation 5)}$$

where $$v(t, t_r, RC) = \begin{cases} \dfrac{t}{t_r} - \dfrac{RC}{t_r}(1 - e^{-t/RC}) & 0 \leq t < t_r \\ 1 - \dfrac{RC}{t_r}(e^{-(t-t_r)/RC} - e^{-t/RC}) & t_r \leq t \end{cases} \quad \text{(Equation 6)}$$

Figure 4:
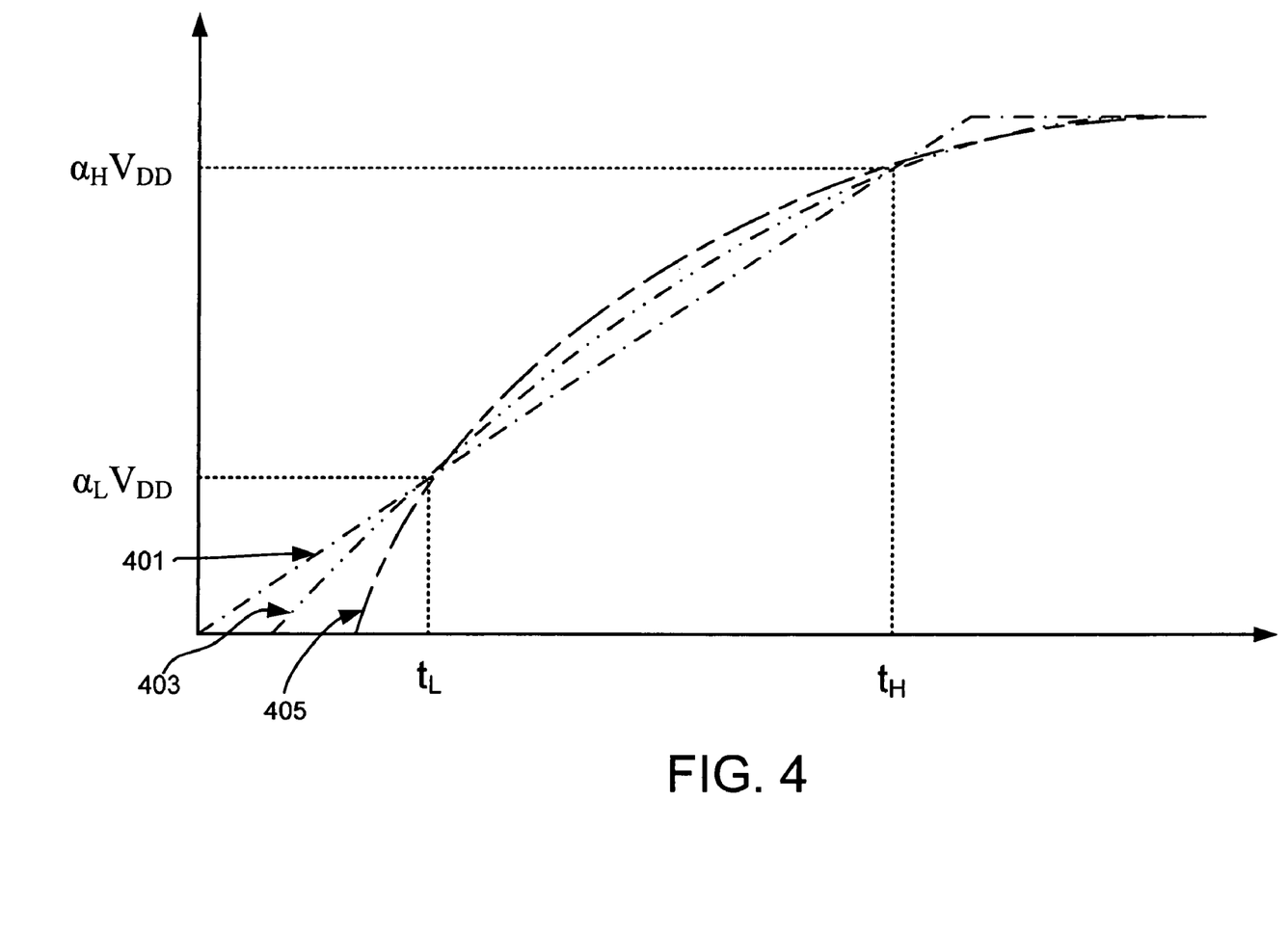
FIG. 4 shows different circuit operating characteristics that share a common output slew.

While this generic Thevenin model can be used to describe the delay ($t_{delay}$) and output slew ($t_{slewOut}$) for a cell, this model alone does not describe the specific operating characteristics of the cell. For example, using a variety of combinations of values for $t_r$ and R with this generic model will provide the same output slew ($t_{slewOut}$), but each combination of values for $t_r$ and R will produce different operating characteristics, as graphically illustrated in FIG. 4. More particularly, as seen in this figure, the cell operating characteristics 401 provided by one combination of $t_r$ and R values will be different from the operating characteristics 403 and the operating characteristics 405 provided by alternate combinations of $t_r$ and R values.

According to various embodiments of the invention, this conventional generic Thevenin model is used to create an osculating Thevenin model by more accurately osculating the parameters for $t_0$, $t_r$ and R, rather than (or in addition to) interpolating these parameters. The model generation techniques according to various embodiments of the invention may employ the information expressed in Equation 6 to expressly or inherently determine the curves for the values of $t_{delay}$ and $t_{slewOut}$ versus $C_L$. From this information, these embodiments of the invention determine the tangents to these curves, which describe the load sensitivities for the cell.

A circuit model M for a cell can be considered an osculating circuit model at a given operating capacitance $C_0$ if the model predicts the same delays and slews at $C_0$ as Equation 1 and Equation 2, i.e., if $$t_{delay}^M = f_1(C_0, t_{slewIn}) \quad \text{(Equation 7)}$$

$$t_{slewOut}^M = f_1(C_0, t_{slewIn}) \quad \text{(Equation 8)}$$

and, moreover, the model M replicates one or both of the gate's load sensitivities at $C_0$ as follows:

$$\left. \frac{d}{dC_L} t_{delay}^M \right|_{C_L=C_0} = \frac{df_1}{dC_L}(C_0, t_{slewIn}) \quad \text{(Equation 9)}$$

$$\left. \frac{d}{dC_L} t_{slewOut}^M \right|_{C_L=C_0} = \frac{df_2}{dC_L}(C_0, t_{slewIn}) \quad \text{(Equation 10)}$$

Thus, the osculating model provided by various embodiments of the invention predicts cell timing not just at the given operating capacitance $C_0$, but also for loads (including non-capacitive loads) near $C_0$.

Using the information described in Equation 7, Equation 8, Equation 9, and Equation 10, and the provided cell characteristics, the Thevenin design table generator module 205 generates tables that can be used to quickly and efficiently create a Thevenin model of the cell's operation. More particularly, the Thevenin design table generator module 205 creates tables by using a unit of time that converts the cell's output slew ($t_{slewOut}^G$) into a fixed numerical value, such as $\alpha_H - \alpha_L$. It should be noted that, while the use of the value $\alpha_H - \alpha_L$ is convenient because it is the slew of a ramp when $t_r = 1$, still other embodiments of the invention may employ any suitable fixed numerical values.

The normalization using the fixed numerical value $\alpha_H - \alpha_L$ is accomplished by dividing all quantities described in Equation 7, Equation 8, Equation 9, and Equation 10 with dimensions of time by $$UnitTime \equiv \frac{t_{slewOut}^G}{\alpha_H - \alpha_L} \quad \text{(Equation 11)}$$

For convenience, a normalized quantity will be identified herein with by the placement of a bar over the quantity's symbol. Accordingly, $$\bar{t}_{slewOut}^G = \alpha_H - \alpha_L \quad \text{(Equation 12)}$$

Using this normalization process and the information provided in Equation 6 as well as the defined timing thresholds values $\alpha_L$, $\alpha_D$, $\alpha_H$, the Thevenin design table generator module 205 can create the equations $$v(\bar{t}_L, \bar{t}_r, \overline{RC}) = \alpha_L$$

$$v(\bar{t}_D, \bar{t}_r, \overline{RC}) = \alpha_D$$

$$v(\bar{t}_H, \bar{t}_r, \overline{RC}) = \alpha_H \quad \text{(Equations 13)}$$

for the threshold crossing times. Together with the normalization constraint, $$\bar{t}_H - \bar{t}_L = \alpha_H - \alpha_L \quad \text{(Equation 14)}$$

the Thevenin design table generator module 205 can produce four equations with five unknown values. Further, the Thevenin design table generator module 205 can solve this system of equations for $\bar{t}_L$, $\bar{t}_D$, $\bar{t}_H$ and $\overline{RC}$ in terms of $\bar{t}_r$. Because a cell's delay, output slew and load sensitivities can be computed from $\bar{t}_L$, $\bar{t}_D$, $\bar{t}_H$, $\overline{RC}$ and $\bar{t}_r$, these values can also be regarded as functions of $\bar{t}_r$, providing the following definitions for a Thevenin design table:

$$\overline{RC} = A_1(\bar{t}_r)$$

$$\bar{t}_D = A_2(\bar{t}_r)$$

$$\overline{RC}(\partial \bar{t}_{delay}/\overline{RC}) = A_3(\bar{t}_r)$$

$$\overline{RC}(\partial \bar{t}_{slewOut}/\overline{RC}) = A_4(\bar{t}_r) \quad \text{(Equations 15)}$$

To calculate a set of design tables for a specific cell, the Thevenin design table generator module 205 solves Equations 13 and Equations 14 for $\bar{t}_r = 1$ as follows:

$$x = \begin{bmatrix} \bar{t}_L \\ \bar{t}_D \\ \bar{t}_H \\ \overline{RC} \end{bmatrix} = \begin{bmatrix} \alpha_L \\ \alpha_D \\ \alpha_H \\ 0 \end{bmatrix} \quad \text{(Equation 16)}$$

Subsequently, $\bar{t}_r$ is replaced with $\bar{t}_r - d\bar{t}_r$, and a new vector x then is found by iteratively solving $$Mdx = -F \quad \text{(Equation 17)}$$

where $$M = \begin{bmatrix} \partial v_L/\partial \bar{t} & 0 & 0 & \partial v_L/\partial \overline{RC} \\ 0 & \partial v_D/\partial \bar{t} & 0 & \partial v_D/\partial \overline{RC} \\ 0 & 0 & \partial v_H/\partial \bar{t} & \partial v_H/\partial \overline{RC} \\ -1 & 0 & 1 & 0 \end{bmatrix} \quad \text{(Equation 18)}$$

and $$F = \begin{bmatrix} v_L - \alpha_L \\ v_D - \alpha_D \\ v_H - \alpha_H \\ \bar{t}_H - \bar{t}_L - (\alpha_H - \alpha_L) \end{bmatrix} \quad \text{(Equation 19)}$$

It should be noted that, with the notation system used herein, the subscript to the character "v" indicates that crossing time at which that quantity is evaluated. For example, $\partial v_L/\partial \bar{t}$ is the partial differential of Equation 6 with respect to time t evaluated at $\bar{t} = \bar{t}_L$. M is then the differential of Equations 13 and Equation 14 with $\bar{t}_r$ fixed, while F is the residual error.

Using, for example, Newton-Raphson iterations to converge the vector x, the Thevenin design table generator module 205 determines the values of $A_1$ and $A_2$ at $\bar{t}_r - d\bar{t}_r$ from the second and fourth components of x. The Thevenin design table generator module 205 then calculates the delay and output slew sensitivities, as follows:

$$\frac{\partial \bar{t}_{delay}}{\partial \overline{RC}} = -\frac{\partial v_D/\partial \overline{RC}}{\partial v_D/\partial \bar{t}}, \quad \text{(Equations 20)}$$

$$\frac{\partial \bar{t}_{slewOut}}{\partial \overline{RC}} = \frac{\partial v_L/\partial \overline{RC}}{\partial v_L/\partial \bar{t}} - \frac{\partial v_H/\partial \overline{RC}}{\partial v_H/\partial \bar{t}}$$

where the subscript on the character "v" indicates that crossing time at which the partial differential value of that quantity is evaluated. It also should be appreciated that Equations 20 make use of the identity $$F(x, y) = 0 \Rightarrow \frac{dy}{dx} = -\left(\frac{\partial F}{\partial y}\right)\bigg/\left(\frac{\partial F}{\partial x}\right) \quad \text{(Equation 21)}$$

From the solution of Equations 20, the Thevenin design table generator module 205 can determine the values of $A_3$ and $A_4$. The Thevenin design table generator module 205 then repeats this process for decrementing values of $\bar{t}_r$, until it determines the design table values for all desired values of $\bar{t}_r$, in the range of [0,1].

Referring back to FIG. 3, in step 305 the Thevenin model generator module 207 uses the design tables to generate an osculating Thevenin model of the cell for a given operating capacitance $C_0$ and the input slew ($t_{slewIn}$) provided by the input/output terminal 203. The given operating capacitance $C_0$ may be any desired capacitance, such as the total capacitance to ground for the RC network of the cell. As previously noted, the given operating capacitance $C_0$ may be provided by the input/output terminal 203. With alternate embodiments of the invention, however, the given operating capacitance $C_0$ may be expressly or inherently provided by the Thevenin design table generator module 205.

More particularly, the Thevenin model generator module 207 first interpolates table $A_4$ to obtain $\bar{t}_r$ such that $$A_4(\bar{t}_r) = \frac{C_0 S_{slewOut}^G}{UnitTime} \quad \text{(Equation 22)}$$

It should be noted that, since the value of R is constant but unknown at this point in the calculation, the equivalence $$\overline{RC} \frac{\partial \bar{t}_{slewOut}}{\partial \overline{RC}} = \overline{C} \frac{\partial \bar{t}_{slewOut}}{\partial \overline{C}} = C \frac{\partial \bar{t}_{slewOut}}{\partial C} \quad \text{(Equation 23)}$$

underlies Equation 22.

Next, the Thevenin model generator module 207 determines the value of $t_r$ as $$t_r = \bar{t}_r * UnitTime \quad \text{(Equation 24)}$$

determines the value R as $$R = \frac{\overline{RC}}{C_0} * UnitTime \quad \text{(Equation 25)}$$

and determines the value of $t_0$ as $$t_0 = t_{delay}{}^G - \bar{t}_D * UnitTime \quad \text{(Equation 26)}$$

where $\overline{RC} = A_1(\bar{t}_r)$ and $\bar{t}_D = A_2(\bar{t}_r)$.

Thus, the Thevenin model generator module 207 generates an osculating Thevenin model of the cell that provides the cell's target delay, output slew ($t_{slewOut}{}^G$) and slew sensitivity for the given operating capacitance $C_0$ and the input slew ($t_{slewIn}$). Some or all of this information may be provided, for example, to the input/output terminal 203 for review by a designer or tester of the circuit structure. Alternately or additionally, the target delay, output slew ($t_{slewOut}{}^G$), slew sensitivity or some combination thereof may be automatically provided to another device, such as an automatic testing device or to a design checking device.

Determination of Effective Capacitance

As previously noted, various embodiments of the invention may optionally include an effective capacitance determination module 209 as illustrated in FIG. 2. With these embodiments, this optional effective capacitance determination module 209 may additionally determine the effective capacitance $C_{eff}$ of the cell in step 307. As previously noted, the Thevenin model generator module 207 generates an osculating Thevenin model of the cell that provides the cell's target delay, output slew ($t_{slewOut}{}^G$) and slew sensitivity for the given operating capacitance $C_0$ and the input slew ($t_{slewIn}$). Thus, the cell delay set forth in this model $t_{delay}{}^M(C_0)$ is the actual cell delay (i.e., the same as the model's (M) delay, by construction) when loaded by $C_0$.

Using this model, the effective capacitance determination module 209 simulates driving the RC network of the cell to obtain delay ($t_{delay}{}^M(RC)$). This delay can be efficiently determined since both M and the RC network are linear circuits. With various embodiments of the invention, for example, the effective capacitance determination module 209 may compute the pole/residue representation of the RC network (including the resistor for the model), express its ramp response analytically, and then find threshold crossings times by Newton-Raphson iterations. Of course, those of ordinary skill in the art will appreciate that still other techniques for simulating driving the RC network of the cell may be employed according to alternate embodiments of the invention.

Once the delay ($t_{delay}{}^M(RC)$) is determined, the effective capacitance determination module 209 estimates $C_{eff}$ from the following equation:

$$t_{delay}{}^M(RC) - t_{delay}{}^M(C_0) \approx S_{delay}{}^{M*}(C_{eff} - C_0) \quad \text{(Equation 27)}$$

where $$S_{delay}{}^M \equiv \partial t_{delay}{}^M / \partial C = A_3(\bar{t}_r)/C_0 \quad \text{(Equation 28)}$$

If the $C_{eff} \approx C_0$ and $t_{delay}{}^M(RC) \approx t_{delay}{}^M(C_{eff})$, where Ceff is the estimated value of the actual effective capacitance $C_{eff}$, then the effective capacitance determination module 209 determines that the effective capacitance $C_{eff}$ of the cell is approximately equal to the original given operating capacitance $C_0$. If however, these conditions are not true, then the effective capacitance determination module 209 sets a new given operating capacitance $C_0$ to be equal to the estimated effective capacitance $C_{eff}$. These steps then are repeated until the above-described conditions are met, thereby providing the actual effective capacitance $C_{eff}$ for the cell. More particularly, the effective capacitance determination module 209 provides the new given operating capacitance $C_0$ to the Thevenin model generator module 207, which in turn generates a new osculating Thevenin model of the cell for the new given operating capacitance $C_0$. The effective capacitance determination module 209 then repeats the process of estimating the effective capacitance $C_{eff}$ for the cell and subsequently determining if $C_{eff} \approx C_0$ and $t_{delay}{}^M(RC) \approx t_{delay}{}^M(C_{eff})$. Typically, however, the osculating Thevenin models provided by various embodiments of the invention are so powerful that suitable results are provided without repeating these steps. Further, repeating these steps usually converges to provide the actual effective capacitance $C_{eff}$ for the cell in two or three cycles even with very stringent convergence tolerances.

While particular embodiments of the invention have been described, it should be appreciated that various alternate embodiments of the invention also may be employed. For example, some embodiments of the invention may omit the use of both the Thevenin design table generator module 205 and the Thevenin design tables. Instead, the Thevenin model generator module 207 may generate an osculating Thevenin model of the cell directly from solving Equation 7, Equation 8, Equation 9 and Equation 10, using, for example, numerical methods. It also should be appreciated that other types of models, including different types of Thevenin models, may be employed by various embodiments of the invention. For example, rather than employing the Thevenin model described in Equation 6, some embodiments of the invention may alternately employ a model with an exponential or piecewise linear ramp.

Models for Use with Inductive and Magnetically Coupled Loads

Also, while the embodiments described above are directed to determining the timing for a cell with an RC load, it should be appreciated that still other embodiments of the invention may determine the timing for cells having inductive and magnetically coupled loads in the same manner. More particularly, these alternate embodiments of the invention would include a Thevenin design table generator module 205 or a Thevenin model generator module 207 that employs a Thevenin model template equations and their derivates which describe the operation of a circuit based upon inductive loading or magnetically-coupled loading, rather than employing Equation 7, Equation 8, Equation 9 and Equation 10 described above.

Similarly, these embodiments of the invention may then be used to calculate the effective inductive load or magnetically-coupled load, respectively. For example, embodiments of the invention that determine the circuit characteristics for an inductively loaded cell may include an effective inductance determination module for determining the effective inductance for the cell, in a manner corresponding to that described above for determining the effective capacitance of a capacitively loaded cell. Likewise, embodiments of the invention that determine the circuit characteristics for a cell with a magnetically-coupled load may include an effective magnetic coupling determination module for determining the effective magnetic coupling for the cell, in a manner corresponding to that described above for determining the effective capacitance of a capacitively loaded cell Conclusion While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method of predicting operating characteristics of a circuit structure, comprising:
   obtaining characteristics of a circuit structure;
   obtaining a general model of the circuit structure;
   determining, with a programmed computer, parameters of the general model of the circuit structure such that
   the general model matches one or more of the obtained circuit characteristics at one or more points, and
   a slope of the general model at the one or more points corresponds to one or more of the obtained circuit characteristics, and quantifies a load sensitivity of the circuit structure, wherein the slope is a slope of a curve of values of one of a delay and output slew of the circuit structure versus a load of the circuit structure;
   employing the determined parameters to generate an osculating model of the circuit structure; and
   using the osculating model to predict the operating characteristics of the circuit structure.

2. The method recited in claim 1, wherein the general model is a model of a circuit structure selected from the group consisting of: a circuit structure with a capacitive load, a circuit structure with an inductive load, and a circuit structure with a magnetically-coupled load.

3. The method recited in claim 1, wherein
   the general model is a model of a circuit structure with a capacitive load, and
   the predicted operating characteristics include timing characteristics.

4. The method recited in claim 3, wherein
   the timing characteristics include delay and output slew, and
   the input characteristics include an input slew, threshold values by which the output slew is defined, and a capacitance value for the circuit structure.

5. The method recited in claim 4, wherein the capacitance value is an effective capacitance for the circuit structure.

6. The method recited in claim 4, wherein the capacitance value is an operating capacitance.

7. The method recited in claim 6, further comprising employing the osculating model to determine an effective capacitance of the circuit structure.

8. The method recited in claim 1, further comprising:
   employing the determining parameters to create a table of values for an osculating model, and
   generating an osculating model of the circuit structure from the table of values.

9. The method recited in claim 1, wherein the general model and the osculating model are Thevenin models.

10. The method recited in claim 9, wherein the general model and the osculating model describe an exponential or piecewise linear ramp.

11. A tool for predicting operating characteristics of a circuit structure, comprising:
    an input terminal for provided input characteristics of a circuit structure;
    a model generator module that employs determined parameters in a general model of the circuit structure to generate, using a programmed computer, an osculating model of the circuit structure, the determined parameters being such that
    the general model of the circuit structure employing the determined parameters matches one or more of the obtained circuit characteristics at one or more points, and
    a slope of the general model at the one or more points corresponds to one or more of the obtained circuit characteristics and quantifies a load sensitivity of the circuit structure, wherein the slope is a slope of a curve of values of one of delay and output slew of the circuit structure versus a load of the circuit structure.

12. The tool recited in claim 11, further comprising a design table generator module that
    determines parameters of a general model of the circuit structure such that
    the general model matches one or more of the obtained circuit characteristics at one or more points, and
    a slope of the general model at the one or more points corresponds to one or more of the obtained circuit characteristics; and
    employs the determined parameters to construct tables for generating the osculating model.

13. The tool recited in claim 12, wherein the model generator module employs the tables to generate the osculating model.

14. The tool recited in claim 11, wherein the model generator module determines parameters of a general model of the circuit structure such that
    the general model matches one or more of the obtained circuit characteristics at one or more points, and
    a slope of the general model at the one or more points corresponds to one or more of the obtained circuit characteristics.

15. The tool recited in claim 11, further comprising an effective load determination module for determining an effective load of the circuit structure using the osculating model.

16. The tool recited in claim 15, wherein the effective load determination module determines an effective capacitance of the circuit structure.

17. The tool recited in claim 11, wherein the general model and the osculating model are Thevenin models.

18. The tool recited in claim 17, wherein the general model and the osculating model describe an exponential or piecewise linear ramp.

* * * * *